United States Patent

Freund et al.

[11] Patent Number: 6,137,305
[45] Date of Patent: Oct. 24, 2000

[54] METHOD AND APPARATUS FOR TESTING LASER BARS

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[21] Appl. No.: 09/178,900

[22] Filed: Oct. 26, 1998

[51] Int. Cl.[7] .................................................. G01R 31/26
[52] U.S. Cl. ............................................ 324/767; 324/754
[58] Field of Search .................................... 324/765, 766, 324/767, 760, 754; 438/14, 15, 17; 174/52.1, 52.2, 52.3, 52.4, 260

[56] References Cited

U.S. PATENT DOCUMENTS

| | | | |
|---|---|---|---|
| 4,716,124 | 12/1987 | Yerman et al. | 438/15 |
| 4,779,047 | 10/1988 | Solstad et al. | 324/760 |
| 4,855,672 | 8/1989 | Shreeve | 324/760 |
| 4,956,605 | 9/1990 | Bickford et al. | 174/52.4 |

*Primary Examiner*—Ernest Karlsen
*Attorney, Agent, or Firm*—Darby & Darby

[57] ABSTRACT

A method and apparatus are disclosed for testing individual laser chips located on a laser bar containing a plurality of chips. Laser bars are transported widthwise on a moving plastic film sheet, which is passed over an elongated pedestal which is aligned with the film sheet. The pedestal has a width which is less than the length of a laser bar, so that the unsupported portion of the plastic film under the ends of the laser bars may be drawn downward and away from the bar. This provides access to the metalized underside of the bar, which serves as a common N-contact for all of the laser chips on the bar. A probe is placed in contact with the undersurface of the bar, and at least one additional probe is placed in contact with a P-contact on one of the laser devices. A chip activation signal is applied between the two probes, and a sensor detects whether or not the chip being probed emits radiation. Failure to emit radiation or to emit radiation in an expected manner is indicative of a bad chip.

10 Claims, 1 Drawing Sheet

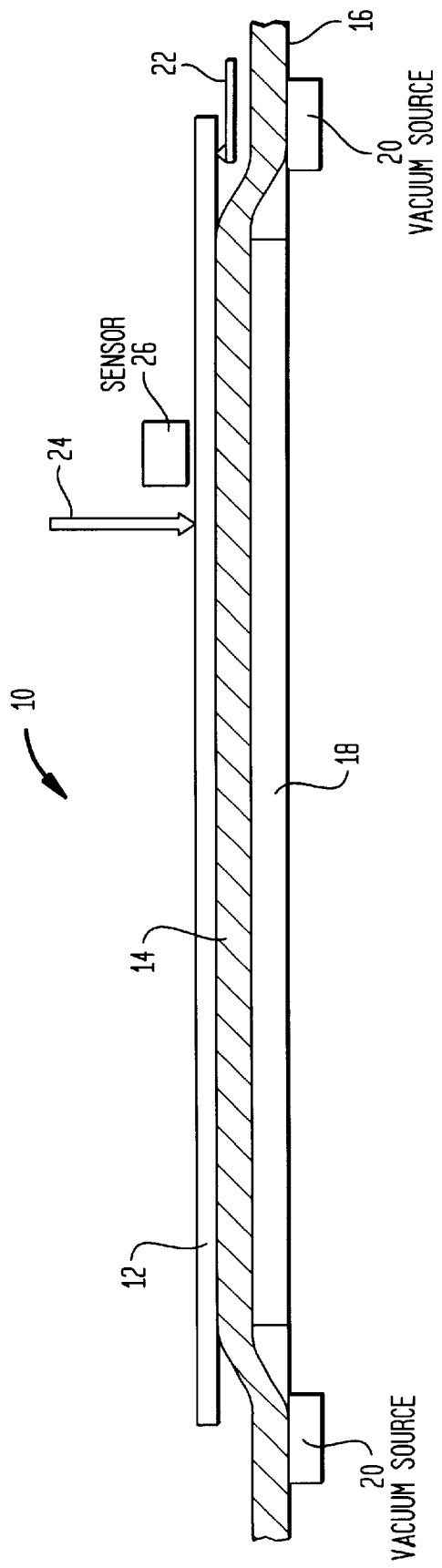

METHOD AND APPARATUS FOR TESTING LASER BARS

FIELD OF THE INVENTION

The present invention relates generally to testing of integrated circuits, and more particularly, concerns a method and apparatus for probing laser bars, which are an intermediate structure in the manufacture of laser chips.

BACKGROUND OF THE INVENTION

Integrated circuit laser devices are manufactured on wafers which are two inches in diameter and about 12–20 mils thick. After initial manufacture, the wafers are thinned to about 3.5–4.5 mils and separated into smaller units, called sections, with four sections being derived from a single wafer. The sections are trimmed in one dimension, which we will call length, to be about 0.4 inches long. They are also scored across their widths to form 20–30 subdivisions, called bars, which are about 12 mils wide and about 0.4 inches long.

During subsequent processing, the sections are divided into bars by breaking or cleaving them along the scribe lines, to form facets along their elongated sides. After the cleaving process, the cleaved laser bars are transported side-by-side on a plastic film sheet, with their lengths extending laterally of the sheet.

Testing of the individual laser devices on each bar is often performed at this time. However this currently requires that the bars be removed from the film sheet and be subjected to a considerable amount of physical handling, in order to be placed into and subsequently removed from a testing fixture. There is a substantial risk that the bar or some of the devices on it will be damaged or destroyed in the course of such handling.

In accordance with the present invention, the film carrying the laser bars is passed over an elongated pedestal which is aligned with the film sheet.

The pedestal has a width which is less than the length of a laser bar, so that the unsupported portion of the plastic film under the ends of the laser bars may be drawn downward and away from the bar. This provides access to the metalized underside of the bar, which serves as a common N-contact for all of the laser chips on the bar. A probe is placed in contact with the undersurface of the bar, and at least one additional probe is placed in contact with a P-contact on one of the laser devices. A chip activation signal is applied between the two probes, and a sensor detects whether or not the chip being probed emits radiation. Failure to emit radiation or to emit radiation in an expected manner is indicative of a bad chip.

BRIEF DESCRIPTION OF THE DRAWINGS

The foregoing brief description as well as further objects, features and advantages of the present invention will be understood more completely from the following detailed description of a presently preferred, but nevertheless illustrative, embodiment in accordance with the present invention, with reference being had to the accompanying drawing in which the sole FIGURE is a schematic front view, with parts in section, illustrating how the individual devices on a laser bar may be tested on a production line, without physical handling of the bars.

DETAILED DESCRIPTION OF THE PREFERRED EMBODIMENT

Turning now to the drawing, the sole FIGURE is schematic front view of a testing station 10 for laser bars in accordance with the present invention. In the FIGURE, there is shown a laser bar 12 oriented with its length extending laterally, across the drawing and its width extending into the drawing. In a typical application, there would be other laser bars directly behind and in front of the bar being tested, although they are not visible in the drawing.

On the production line, the laser bars are transported widthwise on a flexible film sheet 14 (shown in section), which is supported on a supporting surface 16. At the testing station 10, a pedestal 18 rises above the surface 16. Preferably, the bar 12 reaches its position on the pedestal by being transported up a short ramp portion. Pedestal 18 is shorter than the length of a laser bar 12 and, preferably, is no longer than 90 percent of the length of a laser bar. At the test station 10, a vacuum source 20 mounted under surface 16 acts on the edges of film 14, preferably through apertures provided in surface 16, whereby the edges of film 14 are drawn downwardly, away from laser bar 12. As a result, the ends of laser bar 12 are exposed.

A common structure for laser bars is that the entire undersurface is metalized, defining a common N-contact for all of the devices on the laser bar. Each of the individual laser devices, on the other hand, has a separate P-contact on the top surface of the laser bar. In order to test a laser device, an excitation signal is applied between the P-contact and N-contact, and the signal emitted from the device, typically at the elongated edge of the bar, is sensed. If a laser device does not provide illumination or does not provide the expected type of illumination, it is defective.

At the station 10, a single probe 22 is provided in contact with the undersurface of bar 12. From the preceding discussion, it will be appreciated that probe 22 will provide a common N connection for all of the devices. In addition, one or more P probes 24 are provided for the individual laser devices. For simplicity of description, a single probe 24 is shown, as well as a single light sensor 26. However, it will be appreciated that groups of P probes 24 could be provided, each associated with a corresponding detector 26. For example, if a bar included 30 chips, five probes and sensors could be provided spaced so as to coincide with every sixth chip. This would permit five chips to be tested at a time, after which the probes and sensors would be shifted by one chip positioned for testing the next five chips, and so forth. After all the chips on a laser bar have been tested, the probes could be returned to their original position and the film 14 moved so as to bring the next laser bar into testing position.

From the foregoing description, it will be appreciated that the method and apparatus of the present invention provide for testing laser bars on the production line, without the need to remove them from the film 14 or subject them to any form of physical handling. This should significantly reduce the instance of damaged chips.

Although the invention has been described as applied to laser bars, it will be appreciated that it is equally applicable to testing other types of integrated circuits which are formed on a common substrate and have one metalized surface which defines a common contact for all of the devices. In general, the present invention would be applicable to any integrated circuit structure having a first and second face and a plurality of devices thereon, each device having a first and second terminal, the first terminals of a group of the devices being connected together by a common contact formed on the first face, each device in the group having its second terminal on the second face.

Although preferred embodiments of the invention have been disclosed for illustrative purposes, those skilled in the art will appreciate that many additions, modifications and substitutions are possible, without departing from the scope and spirit of the invention as defined by the accompanying claims.

What is claimed:

1. An apparatus for testing an integrated circuit structure having a first and second face and a plurality of devices thereon, each device having a first and second terminal, the first terminals of a group of said devices being connected together by a common contact formed on the first face, each device in the group having its second terminal on the second face, the structure being supported on a sheet of flexible material on a supporting surface with the first face of the structure in contact with the sheet, said apparatus comprising:

a pedestal interposed between the sheet and the supporting surface so as to protrude above the supporting surface, said pedestal being shorter in a first dimension than the structure, to provide an unsupported portion of the sheet where the structure extends beyond said pedestal;

a first probe in contact with the first face above the unsupported portion of the sheet;

a second probe in contact with a second terminal of one device in the group, a test signal being applied between the first and second probes; and a sensor constructed and positioned to detect whether said one device operates properly in response to the test signal.

2. An apparatus in accordance with claim 1, wherein said one device is a light emitting device, said sensor being constructed to sense light emission from said one device.

3. An apparatus in accordance with claim 2, wherein said structure is a laser bar and said devices are laser devices.

4. An apparatus in accordance with claim 1, further comprising a source of a vacuum positioned below the supporting surface in alignment with the unsupported portion of the sheet, said supporting surface having apertures permitting communication of said vacuum to the unsupported portion, whereby the unsupported portion is drawn downwardly away from the first surface.

5. An apparatus in accordance with claim 4, wherein said structure is a laser bar and said devices are laser devices.

6. An method for testing an integrated circuit structure having a first and second face and a plurality of devices thereon, each device having a first and second terminal, the first terminals of a group of said devices being connected together by a common contact formed on the first face, each device in the group having its second terminal on the second face, the structure being supported on a sheet of flexible material on a supporting surface with the first face of the structure in contact with the sheet, said method comprising the steps of:

interposing a pedestal between the sheet and the supporting surface so as to protrude above the supporting surface, said pedestal being shorter in a first dimension than the structure, to provide an unsupported portion of the sheet where the structure extends beyond said pedestal;

positioning a first probe in contact with the first face above the unsupported portion of the sheet;

positioning a second probe in contact with a second terminal of one device in the group;

applying a test signal between the first and second probes; and sensing whether said one device operates properly in response to the test signal.

7. The method in accordance with claim 6, wherein said one device is a light emitting device, said sensing step sensing light emission from said one device.

8. The method in accordance with claim 7, wherein said structure is a laser bar and said devices are laser devices.

9. The method in accordance with claim 6, further comprising the step of applying a vacuum from below the supporting surface through apertures therein in alignment with the unsupported portion of the sheet, said vacuum being communicated to the unsupported portion, whereby the unsupported portion is drawn downwardly away from the first surface.

10. The method in accordance with claim 9, wherein said structure is a laser bar and said devices are laser devices.

* * * * *